United States Patent
Wu et al.

(10) Patent No.: US 8,384,988 B2
(45) Date of Patent: Feb. 26, 2013

(54) PHOTONIC CRYSTAL AND METHOD OF FABRICATING THE SAME

(75) Inventors: Pu-Wei Wu, Hsinchu (TW); Yi-Jui Huang, Hsinchu (TW); Chun-Han Lai, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 161 days.

(21) Appl. No.: 12/962,106

(22) Filed: Dec. 7, 2010

(65) Prior Publication Data

US 2012/0140314 A1  Jun. 7, 2012

(51) Int. Cl.
*G02F 1/00* (2006.01)
*C25D 1/12* (2006.01)
(52) U.S. Cl. ........................ 359/321; 204/483
(58) Field of Classification Search .......... 359/296, 359/297, 321; 204/471, 483, 509
See application file for complete search history.

(56) References Cited

U.S. PATENT DOCUMENTS

2007/0163486 A1* 7/2007 Hong et al. .................... 117/68

OTHER PUBLICATIONS

"Rapid Fabrication of Cylindrical Colloidal Crystals and Their Inverse Opals", Journal of the Electrochemical Society, vol. 157, No. 3, pp. 23-27 (2010).

* cited by examiner

*Primary Examiner* — William Choi
(74) *Attorney, Agent, or Firm* — Edwards Wildman Palmer LLP; Peter F. Corless

(57) ABSTRACT

A three-dimensional geometric photonic crystal and a method of fabricating the photonic crystal are disclosed. The photonic crystal includes a geometric structure having a plurality of electrophoretic self-assembled particles and the plurality of particles are periodically arranged at any cross sections of the geometric structure. The method includes preparing an electrophoresis deposition suspension, installing first and second electrodes in the electrophoresis deposition suspension with the first electrode being encircled by the second electrode, and applying a voltage to the first electrode and the second electrode to form an electric field between the first and second electrodes, such that particles in the electrophoresis deposition suspension are electrophoretic self-assembled, and a periodically arranged geometric structure is formed. A photonic crystal thus may have a three-dimensional geometric structure in any shape.

12 Claims, 8 Drawing Sheets

PHOTONIC CRYSTAL AND METHOD OF FABRICATING THE SAME

BACKGROUND OF THE INVENTION

1. Field of the Invention

This invention relates to a photonic crystal and a method of fabricating the photonic crystal, and more particularly, to a photonic crystal fabricated by an electrophoretic deposition technique, and a method of fabricating the photonic crystal.

2. Description of Related Art

A photonic crystal has a periodic dielectric distribution, and may be in one, two, or three-dimension. Light interference occurs when light passes a periodically arranged structure. A photonic band gap is generated when the constructive interference increases and the destructive interference decreases, and light is thus limited and controlled to have high reflectivity and high dispersion.

In terms of the functionality, one-dimensional, two-dimensional, and three-dimensional photonic crystals have more applications in various field. A one-dimensional photonic crystal may be a film, such as an anti-reflective film and a total reflection film. A two-dimensional photonic crystal may be a waveguide, a beam splitter, or an interferometer. A three-dimensional photonic crystal may comprise a plurality of nano-scaled, densely and periodically arranged particles.

A one-dimensional photonic crystal is fabricated by growing layers of material that have moderate thickness and reflectivity by a technique to form a semiconductor plating film. Development and etching processes are used to fabricate a two-dimensional photonic crystal, that is, periodically arranging a high-k material, or forming an air column (low-k material) on a silicon substrate. As shown in FIG. 1, a photonic crystal fiber 1 comprises an array of air columns 10 that are formed in a semiconductor 11 by the development process. However, the development process is complicated, time-consuming, hight-cost, and low-yield and is hardly used to fabricate a three-dimensional structure. The development process is further limited by an etching aspect ratio in a semiconductor process, the perpendicularity of top and bottom threshold sizes of holes etched, and the length of a photonic crystal. Accordingly, the photonic crystal fiber 1 has a limited application.

A very large-scale integrated-circuit (VLSI) fabrication technology may be used to fabricate a three-dimensional photonic crystal that has a periodically arranged photonic crystal structure. A wafer lithography process or a process that combines optical and chemical mechanical polishing may be also used to fabricate a similar structure. A gravity sedimentation method and a solution evaporation method are two of the most popular crystal fabricating methods in the art to fabricate a three-dimensional structure. However, it takes a long time to prepare a photonic crystal in the gravity sedimentation method, and the solution evaporation method may form a self-assembly layer that has visible wave stripes, and a plating layer thus has no moderate thickness.

Therefore, how to develop a new-generation technique for fabricating a three-dimensional photonic crystal that has any desirable geometric, periodically arranged structure is becoming one of the most urgent issues in the art.

SUMMARY OF THE INVENTION

The present invention provides a photonic crystal and a method of fabricating the photonic crystal, in order to avoid the drawback of the prior art that the photonic crystal is limited by the development technique.

The photonic crystal of the present invention includes a three-dimensional geometric structure having a plurality of electrophoretic self-assembled particles, wherein the particles are periodically arranged at any cross sections of the geometric structure. In an embodiment of the present invention, the particles are balls or cubes, or have a symmetrical structure, and the geometric structure is a cylinder, rectangle, or polygon.

In an embodiment of the present invention, the geometric structure has an appearance confined by a three-dimensional template that has a plurality of holes when the particles are electrophoretic self-assembled. In another embodiment of the present invention, the geometric structure has a plurality of gaps between the particles, and a material filled in the gaps.

The method includes the steps of (1) preparing an electrophoresis deposition suspension; (2) installing a first electrode in the electrophoresis deposition suspension, and installing a second electrode in the electrophoresis deposition suspension in a manner that the first electrode is encircled by the second electrode; and (3) applying a voltage to the first electrode and the second electrode to form an electric field between the first electrode and the second electrode, causing particles in the electrophoresis s deposition suspension to be electrophoretic self-assembled to form a geometric structure that has a periodic arrangement at any cross sections.

In an embodiment of the present invention, the first electrode is a conductive cylinder, rectangle, or polygon.

In another embodiment of the present invention, step (3) includes, after the geometric structure is formed, removing the first electrode that is inside the geometric structure.

In yet another embodiment of the present invention, the method further includes filling gaps between the particles with a first type material, then removing the particles, to form a macroporous structure that has a plurality of periodically arranged pores. In still another embodiment of the present invention, the method further includes filling the pores of the porous structure with a second type material, then removing the first type material, to form another geometric structure.

Compared with the prior art, the present invention applies a voltage to electrodes to cause particles to be electrophoretic self-assembled, so as to fabricate a photonic crystal. Therefore, the problems of the prior art that it takes a long time to prepare a colloidal crystal in the gravity sedimentation method and it's difficult to control the appearance of the geometric structure in the solution evaporation method may be solved, and a photonic crystal of the present invention may have three-dimensional geometric structure that has a periodic arrangement at any cross sections.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

The present invention provides a photonic crystal that has a three-dimensional geometric structure formed by a plurality of particles being electrophoresis self-assembly (EPSA), such that the geometric structure has a periodic arrangement at any cross sections. Specifically, the electrophoresis technique is applied to the deposition of the particles of monodisperse distribution, causing the particles to have a long range orderly arranged structure.

Figure 1:
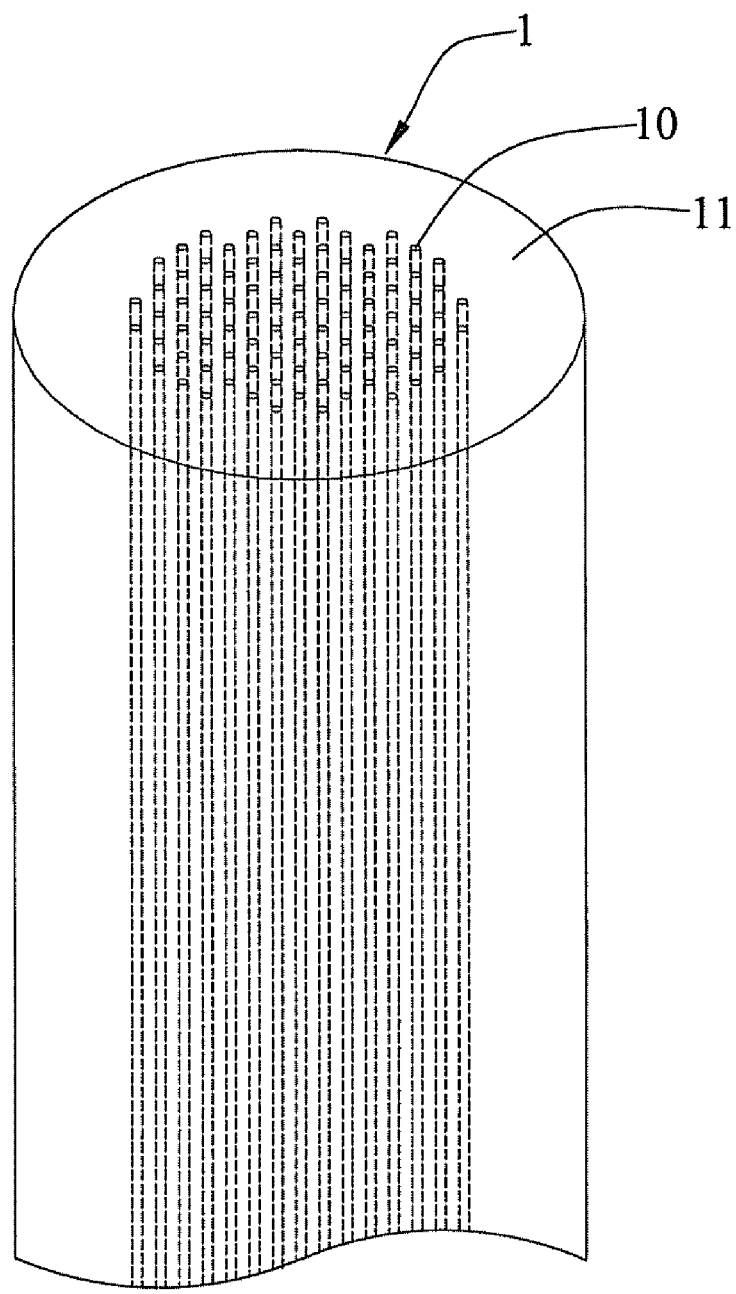
FIG. 1 is a cross-sectional view of a two-dimensional photonic crystal fiber fabricated by a development process according to the prior art.
Figure 2A:
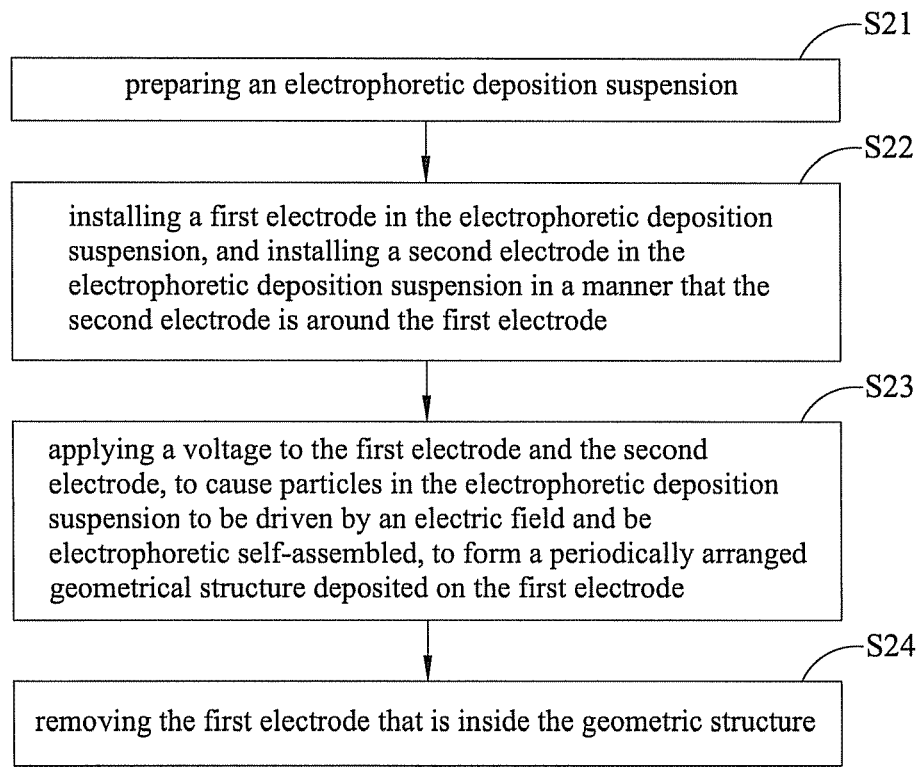
FIG. 2A is a flow chart of a method of fabricating a photonic crystal of a first embodiment according to the present invention.

Please refer to FIG. 2A, which is a flow chart of a method of fabricating a photonic crystal of a first embodiment according to the present invention.

In step S21, an electrophoresis deposition suspension (EPD suspension) is prepared. In the experiment, for example, polystyrene (PS) is selected as the particles, PS microspheres are synthesized via an emulsifier-free emulsion polymerization process, and the obtained PS microspheres are prepared, with ethanol as solvent, to form mono-dispersed electrophoresis deposition suspension. The particles may be a cube or have a symmetrical structure, in addition to the microspheres. Proceed to step S22.

In step S22, a first electrode is installed in the electrophoresis deposition suspension, and a second electrode is installed in the electrophoresis deposition suspension in a manner that the second electrode is encircled by the first electrode. Proceed to step S23.

In step S23, a voltage is applied to the first electrode and the second electrode, to form an electric field between the first electrode and the second electrode. As a result, the particles in the electrophoresis deposition suspension may be driven by the electric field to migrate and assemble themselves to be deposited on the first electrode, to form a periodically arranged geometric structure. The first electrode may be a three-dimensional conductive cylinder, rectangle or polygon. Proceed to step S24.

In step S24, the first electrode inside the geometric structure is removed. What is formed in steps S21 to S23 is the geometric structure that is deposited on the first electrode by the electrophoresis self-assembly. The geometric structure may be formed in the shape of a tube by etching, calcining or other methods to remove the first electrode. The photonic crystal that is electrophoretic self-assembled by the particles has a high enough reflectivity. Accordingly, the tube-shaped geometric structure, with the first electrode removed, may act as a photonic crystal fiber, such that the attenuation of emitted light may be reduced.

The geometric structure that is fabricated in steps S21 to S23 or S21 to S24 shown in FIG. 2A may be a cylinder, rectangle, or three-dimensional polygon structure.

Figure 2B:
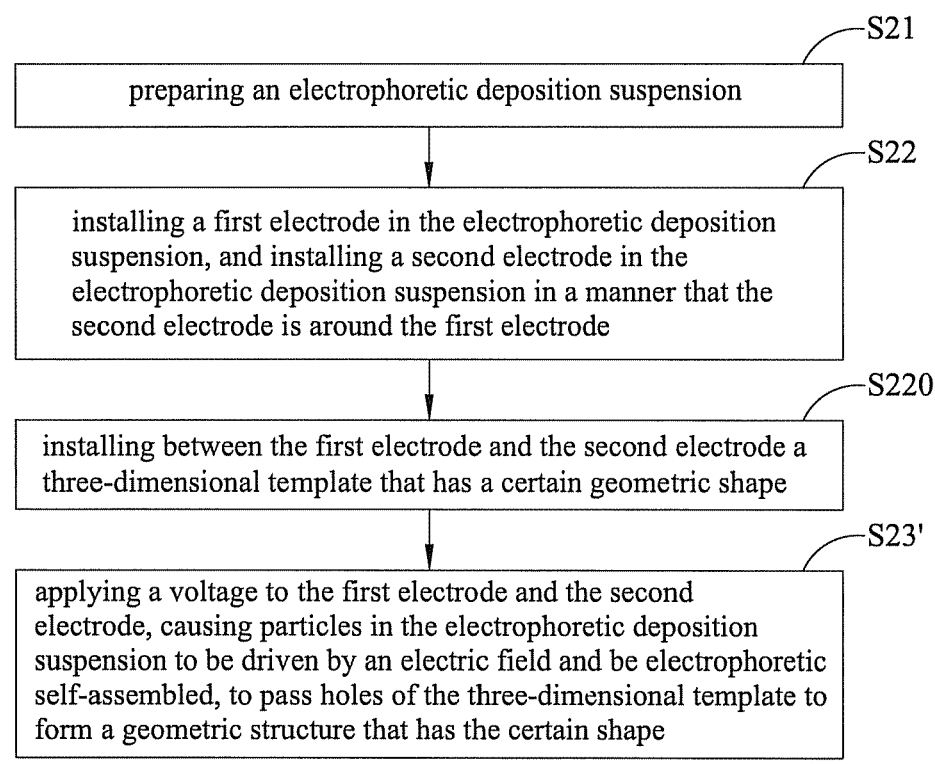
FIG. 2B is a flow chart of a method of fabricating a photonic crystal of a variant of the first embodiment according to the present invention.

Please refer to FIG. 2B, which is a flow chart of a method of fabricating a photonic crystal of a variant of the first embodiment according to the present invention. After steps S21 and S22, in which the EPD suspension is prepared and the first electrode and the second electrode are installed in the EPD suspension, proceed to step S220. In step S220, a three-dimensional template that is in a certain shape and has a plurality of holes is installed between the first electrode and the second electrode. Proceed to step S23'. In step S23', the particles in the EPD suspension, when electrophoretic self-assembled, pass the holes on the three-dimensional template and form between the first electrode and the template a geometric structure in the certain shape, due to the confinement of the three-dimensional template in the certain shape.

Figure 2C:
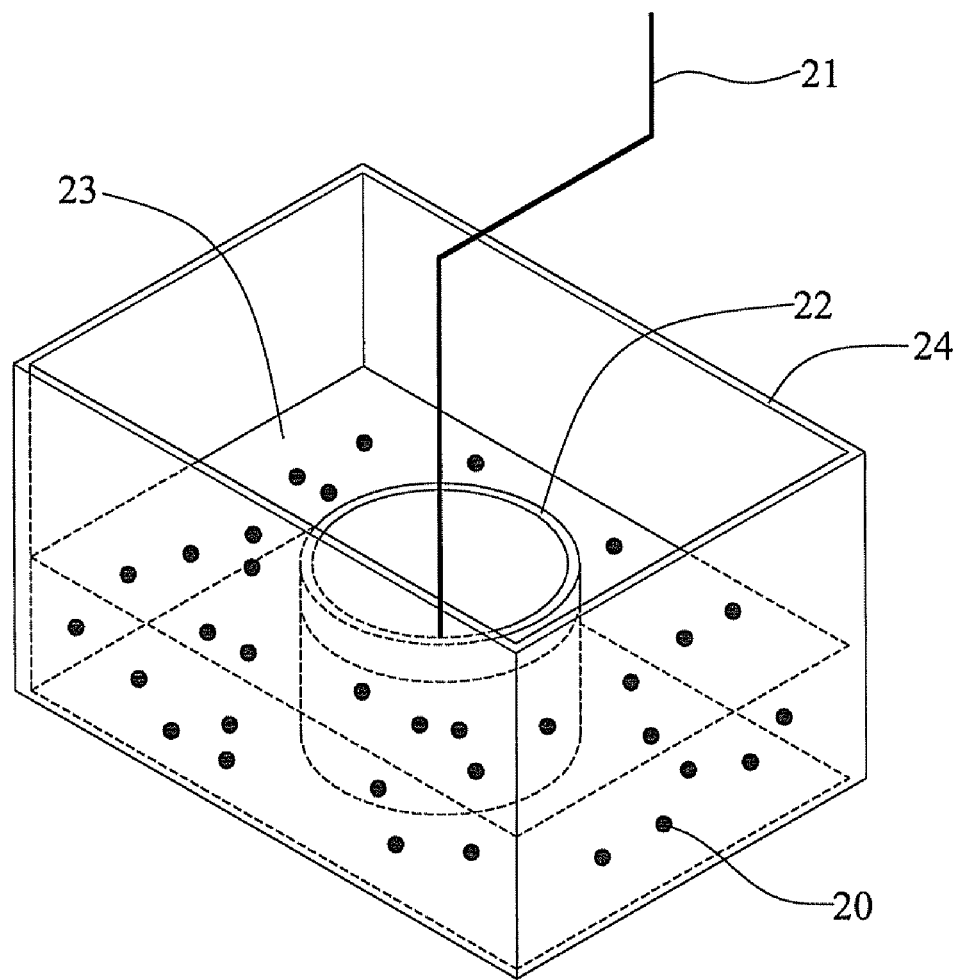
FIG. 2C is a schematic diagram illustrating an experiment disposition for the method of the present invention.
Figure 2D:
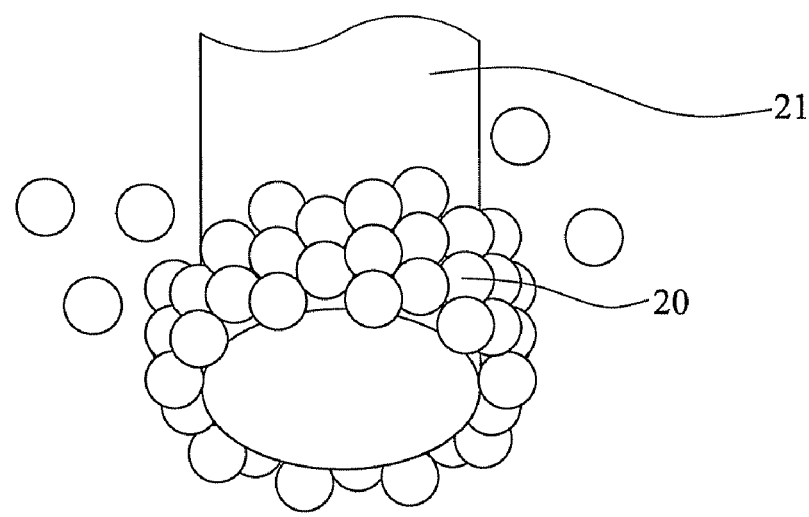
FIGS. 2D and 2E are two schematic diagrams illustrating particles in an electrophoresis self-assembly process according to the present invention.
Figure 2E:
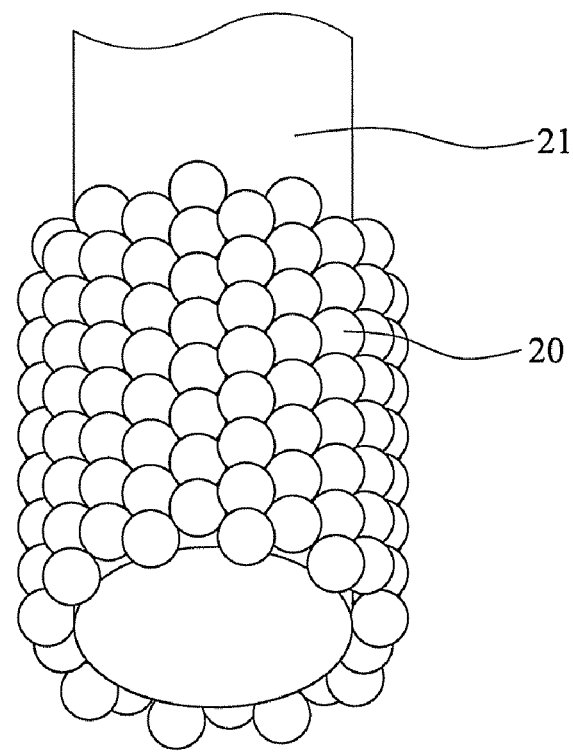

Please refer to FIG. 2C, which is a schematic diagram illustrating an experiment disposition for the method of the present invention. In an electrophoresis tank 24 is contained an electrophoresis deposition suspension 23 that has a concentration between 0.001 g/ml and 0.1 g/ml. Particles 20 are suspended in the electrophoresis deposition suspension 23. The particles 20 may be high polymer such as polystyrene (PS), $SiO_2$, PMMA or other oxide called colloid. The first electrode 21 and the second electrode 22 are immersed in the electrophoresis deposition suspension 23. The first electrode 21 may be a carbon fiber (CF) with a diameter of 7 μm and a length of 2.5 cm, and the second electrode 22 may be a stainless steel tube with a diameter of 4.6 cm and a length of 3 cm. In a preferred embodiment, the first electrode 21 and the second electrode 22 may have an area ratio greater than 1:3. The first electrode 21 and the second electrode 22 are spaced at a distance greater than 0.5 cm. A voltage may be applied to the first electrode 21 and the second electrode 22, in order to form between the first electrode 21 and the second electrode 22 an electric field having an electric intensity between 1V/cm and 100V/cm. The photonic crystal may be fabricated at a temperature between 20° C. to 80° C. As shown in FIG. 2D, the particles 20 are driven by the electric field to migrate, and are self-assembled on the first electrode 21. A geometric structure is then formed, as shown in FIG. 2E.

Note that the parameters described in the context are optimized data in a laboratory, and are not used to limit the geometric structure. For instance, the carbon fiber may be longer, and the second electrode may have a greater diameter. The fabrication parameters that affect the deposition speed of the colloid particles include electrophoresis suspension temperature, electrophoresis deposition suspension concentration, the amplitude of an applied electric field, the material of the electrodes, the pH value of the suspension, and the potential of Zeta on the surfaces of the colloid particles in the suspension.

Figure 2F:
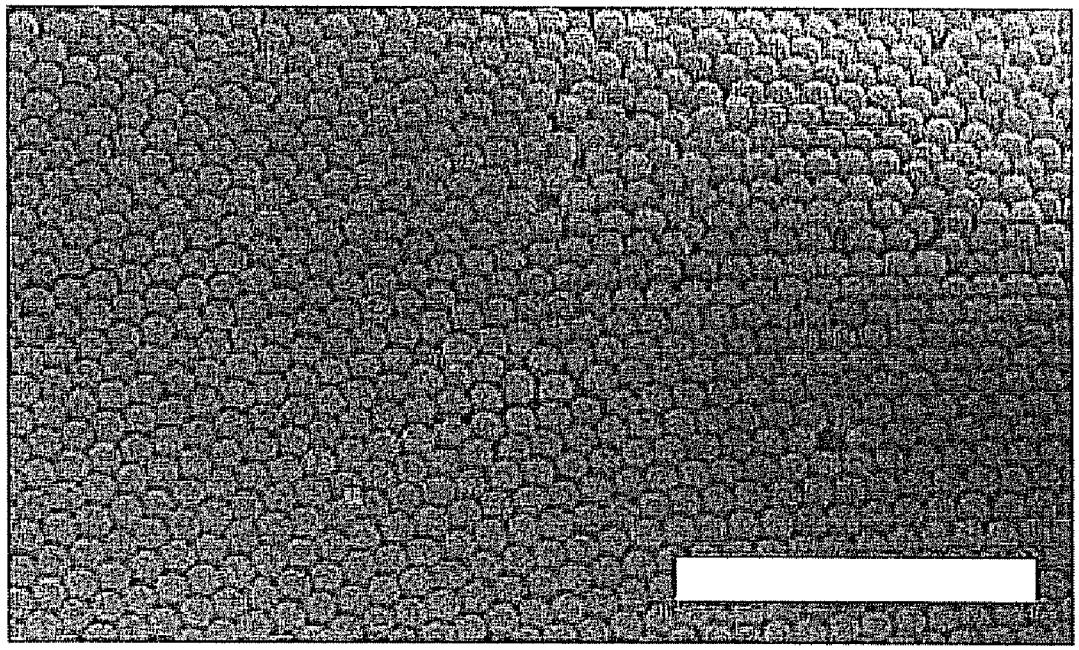
FIG. 2F is a scanning electron microscope image of a geometric structure assembled by a polystyrene colloid according to the present invention.

Please refer to FIG. 2F, which is a scanning electron microscope image of a tube-shaped crystal structure assembled by a PS colloid according to the present invention, in which a carbon fiber with a diameter of 7 μm and a length of 2.5 cm is used as the first electrode, and a cylinder with an inner diameter of 4.25 cm and a length of 3.4 cm is used as the second electrode. The particles have a long range orderly arranged structure.

The photonic crystal fabricated in steps S21 to S23 shown in FIG. 2A has a periodically arranged geometric structure that have a plurality of electrophoretic self-assembled particles.

Figure 3A:
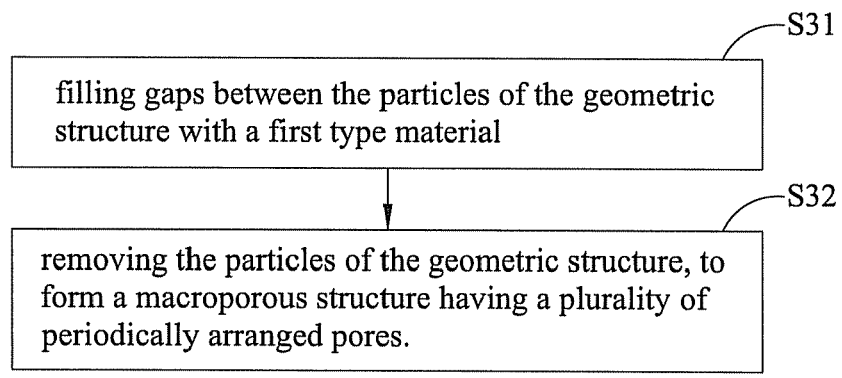
FIG. 3A is a flow chart of a method of fabricating a photonic crystal of a second embodiment according to the present invention.

Please refer to FIG. 3A, which is a flow chart of a method of fabricating a photonic crystal of a second embodiment according to the present invention.

Figure 3B:
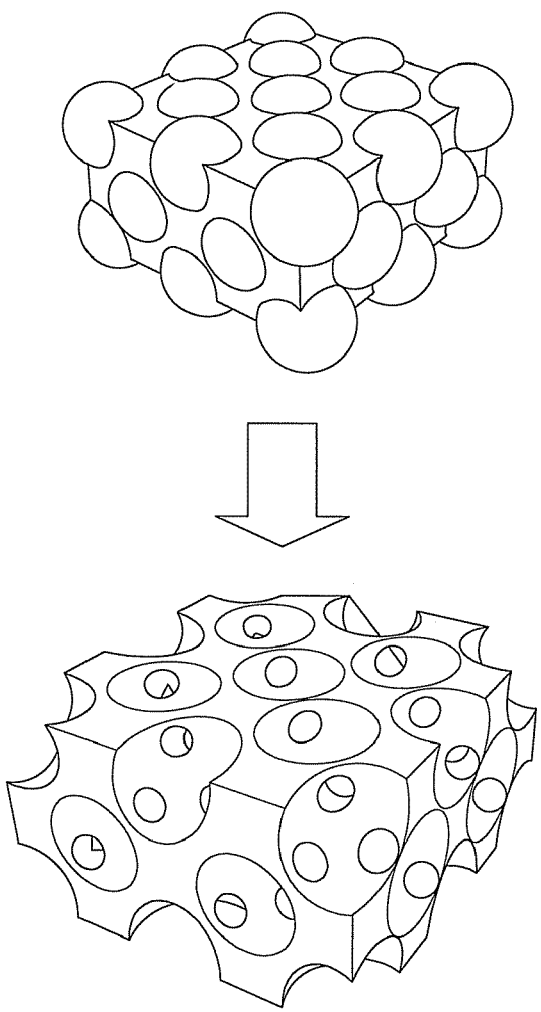
FIG. 3B is a schematic diagram illustrating filling a gap of a geometric structure formed by a plurality of particles with a first-type material according to the present invention.

In step S31, a first type material is filled in gaps between the particles of the geometric structure, to form a core-shell structure, with the first type material as a shell. In step S32, the particles of the geometric structure are removed, to form a macroporous structure having a plurality of periodically arranged pores. FIG. 3B is a schematic diagram illustrating removing the first electrode of the geometric structure shown in FIG. 2E and filling a gap of a geometric structure formed by a plurality of particles with a first-type material according to the present invention.

The first type material may be filled in the gaps between the particles of the geometric structure by electroplating, electroless plating, chemical vapor deposition, physical vapor deposition, sol-gel, EPD or solution colloid techniques. For instance, the photonic crystal may be immersed in an electroplating solution, metal in the electroplating solution are filled in the gaps of the geometric structure by an electrophoretic deposition technique to cause the metal particles to be deposited on surfaces of the particles, and the particles are removed by high temperature calcining or etching techniques, so as to form a metal porous structure. Alternatively, an electrochemical polymerization technique may be used to fill the gaps of the geometric structure, in order to obtain a high-quality polyaniline structure that has a great area.

Figure 3C:
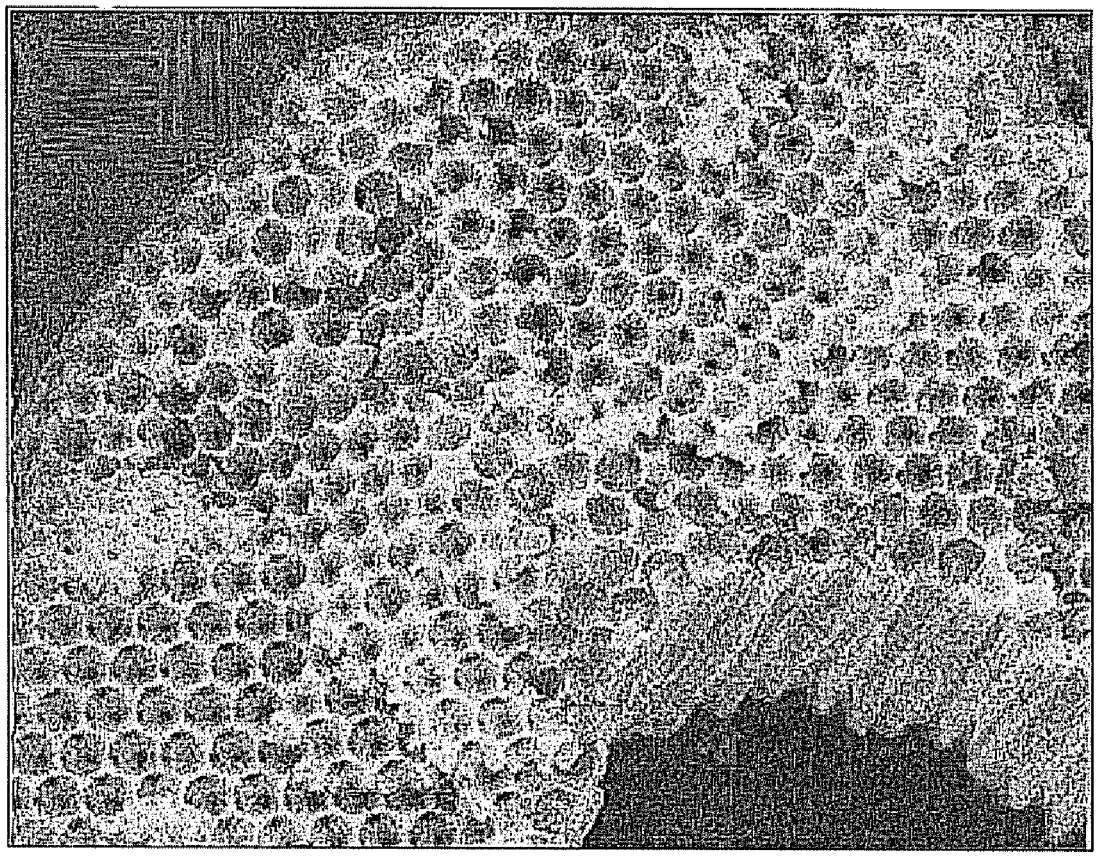
FIG. 3C is a scanning electron microscope image of a macroporous structure that is the geometric structure shown in FIG. 2F, with the gap filled with nickel and the polystyrene colloid removed, according to the present invention.

The macroporous structure that is fabricated from the first type material by steps S21 to S23 shown in FIG. 2A and steps S31 to S32 is called an inverse structure, or an inverse opals structure. Please refer to FIG. 3C, which is a scanning electron microscope image of the geometric structure shown in FIG. 2F, with the gaps filled with nickel and the polystyrene colloid removed, according to the present invention. The macroporous structure, if made from metal, may be similar to bone.

Figure 4:
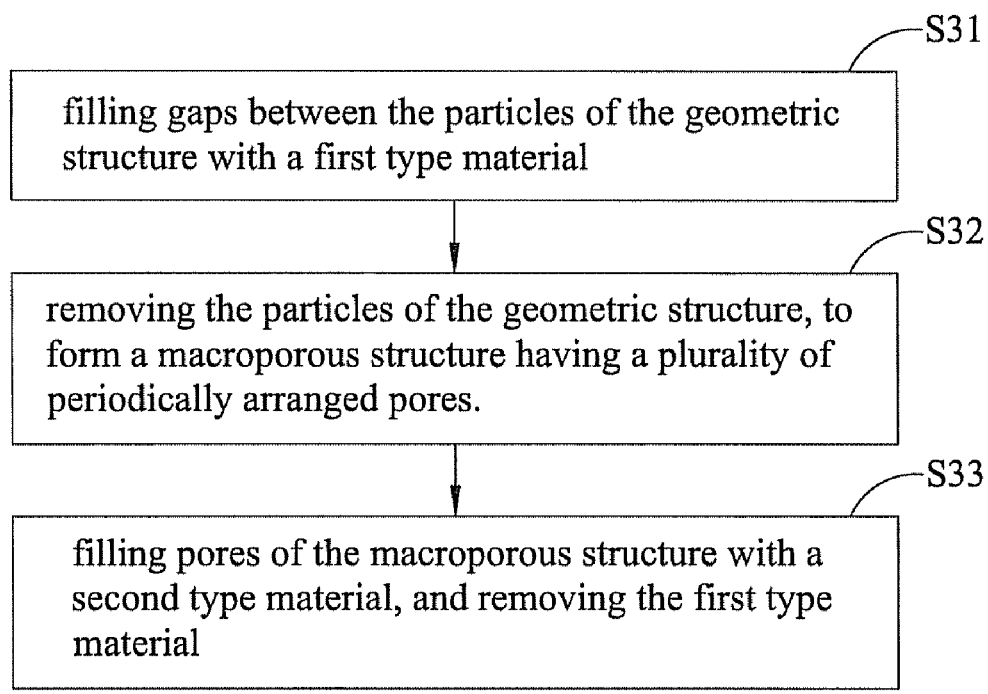
FIG. 4 is a flow chart of a method of fabricating a photonic crystal of a third embodiment according to the present invention.

Proceed to step S33. Please refer to FIG. 4, which shows a third embodiment according to the present invention.

In step S33, a second type material is filled in the pores of the macroporous structure, and the first type material is removed, so as to form another geometric structure that is different from the geometric structure shown in step S32.

The second type material may be filled in the pores of the macroporous structure by electroplating, electroless plating, chemical vapor deposition, physical vapor deposition, sol-gel, EPD or solution colloid techniques, in order to form the geometric structure that is composed by the second type material.

Note that the particles of the geometric structure assembled by the particles are in contact with dots, while the another geometric structure that is assembled by the second type material has a greater contact area than the particles, since the another geometric structure is formed by filling the second type material in the pores of the macroporous structure. Accordingly, the another geometric structure assembled by the second type material has a greater mechanical strength than the geometric structure assembled by the particles.

During the migration and deposition processes of fabricating the photonic crystal, the particles are hard to be self-assembled due to a screening effect. An impulse voltage may be applied to the first electrode and the second electrode, to increase the time for the particles to be self-assembled/migrated and deposited in the electrophoresis suspension or electroplating solution.

Therefore, a photonic crystal and a method of fabricating the photonic crystal of the present invention employ an electrophoresis deposition technique to cause particles to be electrophoretic self-assembled to form a three-dimensional structure in any geometric shape, with periodically arranged at any cross sections. A three-dimensional photonic crystal fabricated by particles is used as a template, in order for a first type material to be filled in gaps between the particles. Therefore, a photonic crystal having an inverse opals structure may be obtained, after the particles are removed.

In conclusion, the photonic crystal and the method for fabricating the same of the present invention has a simple process, low equipment and material cost, and high deposition speed, and is easy to be controller. The photonic crystal fabricated according to the present invention has periodic arrangement at any cross sections.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method of fabricating a photonic crystal, comprising the steps of:
    (1) preparing an electrophoresis deposition suspension;
    (2) installing a first electrode in the electrophoresis deposition suspension, and installing a second electrode in the electrophoresis deposition suspension in a manner that the first electrode is encircled by the second electrode; and
    (3) applying a voltage to the first electrode and the second electrode to form an electric field between the first electrode and the second electrode, causing particles in the electrophoresis deposition suspension to be electrophoretic self-assembled to form a geometric structure that has a periodic arrangement at any cross sections.

2. The method of claim 1, wherein step (3) comprises, after the geometric structure is formed, removing the first electrode inside the geometric structure.

3. The method of claim 1, further comprising filling gaps between the particles with a first type material, then removing the particles, to form a macroporous structure that has a plurality of periodically arranged pores at any cross sections.

4. The method of claim 3, wherein the first type material is filled in the gaps by electroplating, electroless plating, chemical vapor deposition, physical vapor deposition or solution colloid techniques.

5. The method of claim 3, wherein the particles are removed by high temperature calcining or chemical agent etching techniques.

6. The method of claim 3, further comprising filling the pores of the macroporous structure with a second type material, then removing the first type material, to form another geometric structure.

7. The method of claim 1, wherein the particles are balls or cubes, or have a symmetrical structure.

8. The method of claim 1, wherein the first electrode is a conductive cylinder, rectangle, or polygon.

9. The method of claim 1, wherein step (1) comprises installing between the first electrode and the second electrode a three-dimensional template that has a certain geometric shape.

10. The method of claim 9, wherein the three-dimensional template has a plurality of holes, and the particles, when electrophoresis self-assembled, pass through the holes of the three-dimensional template so as to form the geometric structure having the certain geometric shape.

11. The method of claim 10, further comprising filling gaps between the particles of the geometric structure with a first type material, then removing the particles, to form a macroporous structure that has a plurality of periodically arranged pores at any cross sections.

12. The method of claim 11, further comprising filling the pores with a second type material, then removing the first type material, to form another geometric structure.

* * * * *